(12) United States Patent
Hoelen et al.

(10) Patent No.: US 8,541,797 B2
(45) Date of Patent: Sep. 24, 2013

(54) ILLUMINATOR AND METHOD FOR PRODUCING SUCH ILLUMINATOR

(75) Inventors: Christoph Gerard August Hoelen, Eindhoven (NL); Antonius Constant Johanna Cornelis Van Den Ackerveken, Eindhoven (NL); Cornelius Franciscus Jozef Rutjes, Eindhoven (NL); Koen Van Os, Eindhoven (NL); Marc Andre De Samber, Eindhoven (NL); Theodoor Cornelis Treurniet, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 340 days.

(21) Appl. No.: 11/719,240

(22) PCT Filed: Nov. 14, 2005

(86) PCT No.: PCT/IB2005/053742
§ 371 (c)(1),
(2), (4) Date: May 14, 2007

(87) PCT Pub. No.: WO2006/054228
PCT Pub. Date: May 26, 2006

(65) Prior Publication Data
US 2009/0078948 A1 Mar. 26, 2009

(30) Foreign Application Priority Data
Nov. 18, 2004 (EP) .................................. 04105892

(51) Int. Cl.
*H01L 27/15* (2006.01)

(52) U.S. Cl.
USPC 257/98; 257/918; 257/E31.099; 257/E31.105; 257/E33.001; 257/E51.018

(58) Field of Classification Search
USPC ............................................. 438/69
See application file for complete search history.

(56) References Cited

U.S. PATENT DOCUMENTS

| 3,869,637 | A  | * | 3/1975  | Usui .............................. 313/500 |
| 5,397,867 | A  | * | 3/1995  | Demeo .......................... 200/5 A |
| 5,479,029 | A  | * | 12/1995 | Uchida et al. .................... 257/81 |
| 5,498,883 | A  | * | 3/1996  | Lebby et al. ..................... 257/95 |
| 5,710,441 | A  | * | 1/1998  | Ackley et al. .................... 257/98 |
| 6,558,970 | B2 | * | 5/2003  | Sakamoto et al. .............. 438/22 |
| 6,809,261 | B1 | * | 10/2004 | Ng et al. ......................... 174/551 |
| 6,906,863 | B2 | * | 6/2005  | Yoshida et al. ................. 359/584 |
| 6,924,514 | B2 | * | 8/2005  | Suenaga ......................... 257/98 |
| 6,995,402 | B2 | * | 2/2006  | Ludowise et al. .............. 257/91 |
| 7,183,587 | B2 | * | 2/2007  | Negley et al. ................... 257/99 |
| 7,190,002 | B2 | * | 3/2007  | Seong et al. .................... 257/98 |
| 7,358,541 | B2 | * | 4/2008  | Seong et al. .................... 257/98 |
| 2002/0068373 | A1 | * | 6/2002  | Lo et al. .......................... 438/33 |
| 2002/0100164 | A1 | * | 8/2002  | Tanaka et al. ................... 29/832 |

(Continued)

FOREIGN PATENT DOCUMENTS
JP 200422895 1/2004

*Primary Examiner* — Julio J Maldonado
*Assistant Examiner* — Mohammad Choudhry

(57) ABSTRACT

An illuminator includes a substrate, a structured conductive layer applied to one surface of the substrate, and at least one light source connected to the structured conductive layer. The illuminator further includes an unstructured reflective layer applied on top of the structured conductive layer. The unstructured reflective layer has an essentially continuous extension at least in a surrounding of the at least one light source.

8 Claims, 2 Drawing Sheets

(56) References Cited

U.S. PATENT DOCUMENTS

Figure 1:
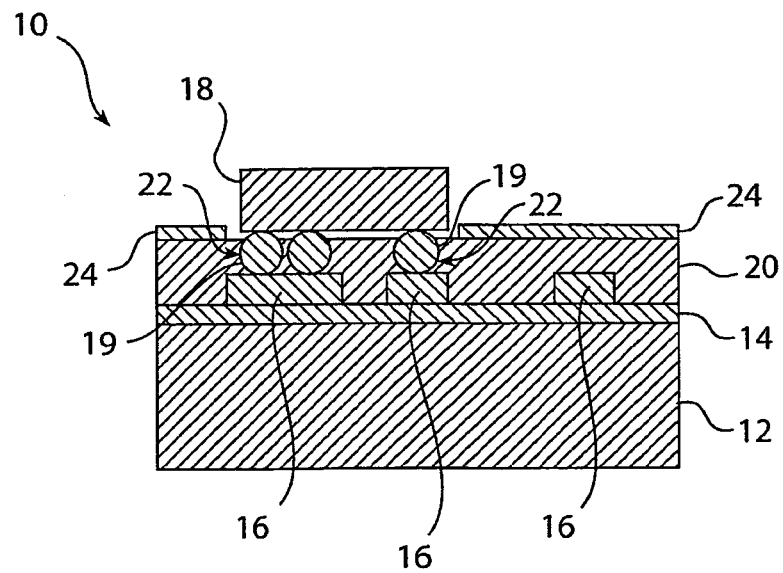

| | | | |
|---|---|---|---|
| 2002/0163302 A1* | 11/2002 | Nitta et al. | 313/512 |
| 2002/0196628 A1* | 12/2002 | Yoshida et al. | 362/296 |
| 2003/0010986 A1* | 1/2003 | Lin et al. | 257/79 |
| 2003/0021520 A1* | 1/2003 | Tungare et al. | 385/16 |
| 2003/0100140 A1* | 5/2003 | Lin et al. | 438/106 |
| 2004/0018670 A1* | 1/2004 | Arao et al. | 438/151 |
| 2004/0026709 A1* | 2/2004 | Bader et al. | 257/103 |
| 2004/0036079 A1* | 2/2004 | Nakada et al. | 257/81 |
| 2004/0080939 A1 | 4/2004 | Braddell et al. | |
| 2004/0104390 A1* | 6/2004 | Sano et al. | 257/78 |
| 2004/0137258 A1* | 7/2004 | Utsumi et al. | 428/629 |
| 2004/0170019 A1* | 9/2004 | Tamai | 362/247 |
| 2004/0184270 A1* | 9/2004 | Halter | 362/296 |
| 2005/0051789 A1* | 3/2005 | Negley et al. | 257/99 |
| 2005/0062060 A1* | 3/2005 | Nagai et al. | 257/100 |
| 2005/0093116 A1* | 5/2005 | Palmteer et al. | 257/676 |
| 2005/0173708 A1 | 8/2005 | Suehiro et al. | |
| 2005/0211991 A1* | 9/2005 | Mori et al. | 257/79 |
| 2006/0097385 A1* | 5/2006 | Negley | 257/722 |
| 2006/0124953 A1* | 6/2006 | Negley et al. | 257/99 |
| 2006/0163601 A1* | 7/2006 | Harle et al. | 257/100 |
| 2006/0243993 A1* | 11/2006 | Yu | 257/95 |
| 2008/0142824 A1* | 6/2008 | Chen et al. | 257/98 |
| 2009/0134421 A1* | 5/2009 | Negley | 257/98 |

\* cited by examiner

ILLUMINATOR AND METHOD FOR PRODUCING SUCH ILLUMINATOR

The present invention relates to an illuminator comprising a substrate, a structured conductive layer applied to one surface of the substrate, and at least one light source connected to the structured conductive layer. The invention also relates to a method for producing such illuminator.

Illuminators based on light emitting diodes (LEDs), in particular multi-chip LED modules, are currently being developed. However, a problem with LEDs is that the light emitted from the LED chip is highly non-directional and non-uniform, which negatively affects the optical efficiency of the LED module.

This problem is addressed in for example the US patent application no. 2004/0080939, which discloses an illuminator comprising light sources, such as LEDs, mounted on a substrate and with a lens covering the light sources. The substrate comprises pads of conductive and reflective material, which pads are electrically connected to the light sources. The reflective pads serves to reflect light emitted by the LEDs in the general plane of the substrate upwardly and out of the lens, whereby the optical efficiency of the illuminator is improved.

However, even if the solution proposed in US2004/0080939 somewhat improves the optical efficiency, light from the LEDs is still absorbed by for example the substrate and the boundaries between the pads. Thus, there is a need for an LED-based illuminator with improved optical efficiency.

It is an object of the present invention to provide an illuminator with improved optical efficiency.

This and other objects that will be evident from the following description are achieved by means of an illuminator, and a corresponding manufacturing method, according to the appended claims.

According to a first aspect of the invention, there is provided an illuminator comprising a substrate, a structured conductive layer applied to one surface of the substrate, at least one light source connected to the structured conductive layer, and an unstructured reflective layer applied on top of said structured conductive layer, which unstructured reflective layer has an, essentially continuous extension at least in a surrounding of the at least one light source.

The conductive layer is structured into a plurality of separate conductive tracks, while the reflective layer is unstructured, i.e. not divided into smaller separate parts. Also, the term unstructured implies that the reflective layer has a surface configuration which is well suited for reflection, i.e. there is no irregularities causing any absorption of light (as for a structured layer), which absorption otherwise negatively effects the reflection efficiency. Thus, the invention is based on the understanding that by providing an unstructured reflective layer above the structured conductive layer, a large area having excellent reflective characteristics for reflecting light generated by the light source(s) away from the substrate can be obtained, which increases the optical efficiency of the illuminator.

It should be noted that even though the reflective layer is unstructured, it can of course comprise contact holes for accommodating one or more light sources.

An advantage offered by the invention according to this embodiment is that a maximum reflective area for reflecting light generated by the light source(s) away from the substrate can be obtained, which in turn helps to maximize the optical efficiency of the illuminator.

In one embodiment of the invention, the unstructured reflective layer covers essentially the entire surface of the substrate. In principle, the reflective layer can cover the entire substrate except where the electrical connectors of the light source(s) makes electrical contact with the conductive layer.

The unstructured reflective layer can be of any appropriate reflective material. Further, the unstructured reflective layer can be conductive or non-conductive. In the former case, the layer preferably comprises one of Ag, Al, Ni and Cr, all of which exhibits excellent reflective characteristics. In the latter case, glassy layers can be used.

Further, in case a conductive unstructured reflective layer is used, the illuminator preferably additionally comprises an isolating layer applied between the unstructured reflective layer and the structured conductive layer. Due to the intermediate isolating layer, any risk for short-circuiting between the unstructured reflective layer and the structured conducting layer is eliminated. The isolating layer preferably comprises contact holes for enabling connection between the light source(s) and the structured conductive layer.

In one embodiment of the invention, the light source is flip chip mounted. Alternatively, the light source can for example be wire bonded. Preferably, the light source is an LED chip. Thus, the illuminator according to the invention can comprise a plurality of flip chip LEDs and/or wire bonded LEDs mounted on a single substrate (i.e. a multi chip LED module/illuminator).

According to another aspect of the invention there is provided a method for manufacturing an illuminator comprising providing a substrate, applying a structured conductive layer on one surface of the substrate, placing at least one light source in connection with the structured conductive layer, and applying an unstructured reflective layer on top of the structured conductive layer, which unstructured reflective layer has an essentially continuous extension at least in a surrounding of the at least one light source. This method offers similar advantages as obtained with the previously discussed aspect of the invention. Also, it should be noted that the order of the steps in the method according to this second aspect is not limited to the order as set forth above. For example, the unstructured reflective layer may be applied before the mounting of the light source(s).

These and other aspects of the present invention will be described in more detail in the following, with reference to the appended figures showing presently preferred embodiments.

Figure 2:
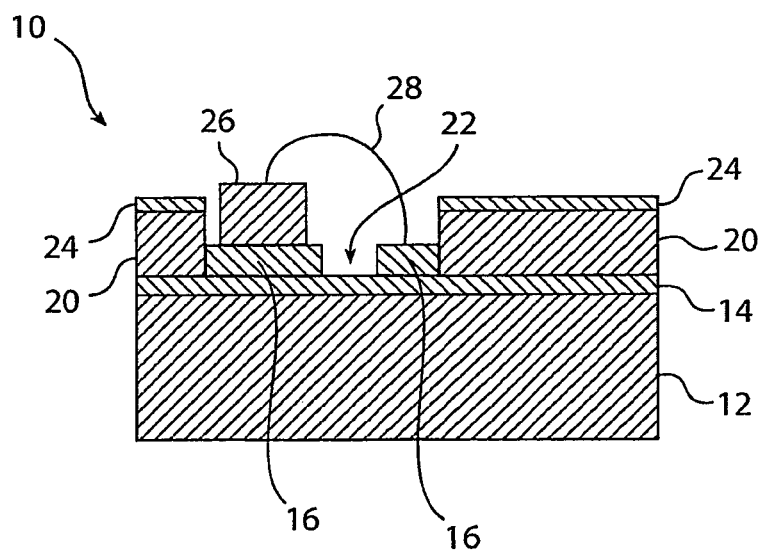
Figure 3A:
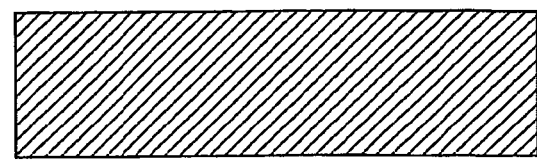
Figure 3B:
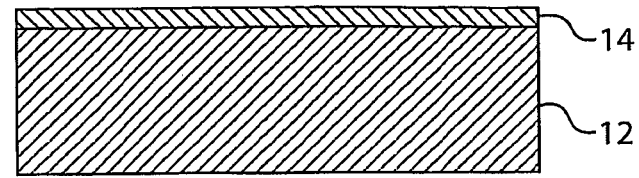
Figure 3C:
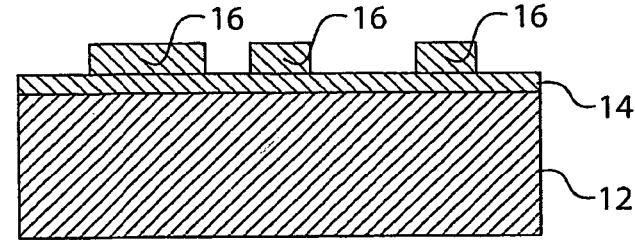
Figure 3D:
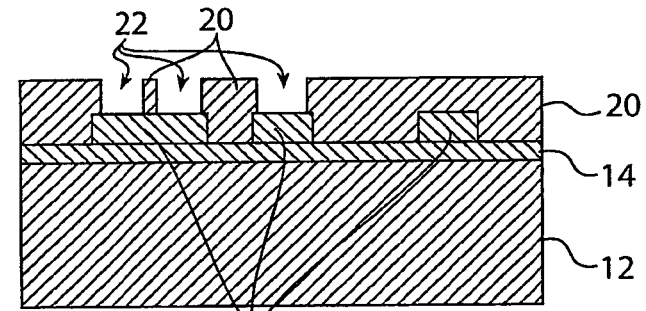
Figure 3E:
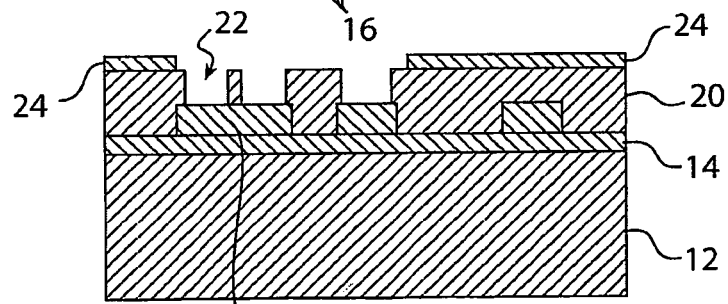
Figure 3F:
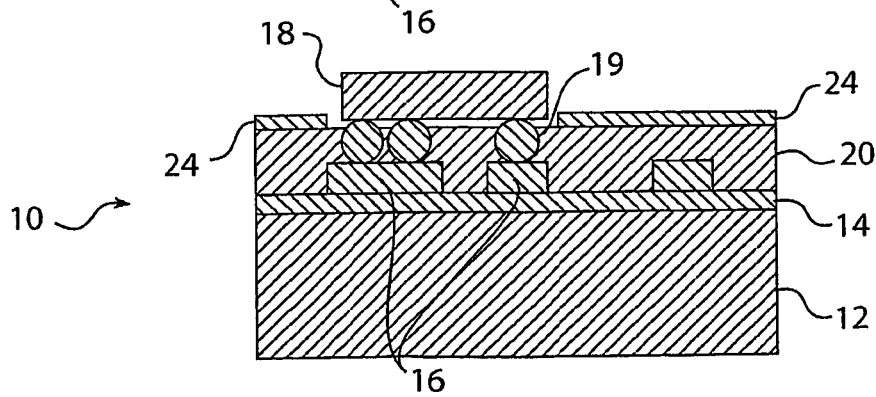

FIG. 1 is a schematic side view of an illuminator according to one embodiment of the present invention comprising a flip chip mounted LED, FIG. 2 is a schematic side view of an illuminator according to another embodiment of the present invention comprising a wire bonded LED chip, and FIGS. 3a-3f show in steps a method for producing an illuminator according to the invention.

FIG. 1 shows an illuminator 10 according to an embodiment of the present invention. The illuminator 10 comprises a substrate 12, for example a silicon substrate, a dielectric layer 14 applied on the top side of the substrate 12, and a structured conductive layer 16 applied on top of the dielectric layer 14. The structured layer 16 covers part of the substrate surface and constitutes conductive tracks to which an LED chip 18 having contact pads 19 is mounted. Thus, by means of the structured conductive layer 16, the LED chip 18 can be electrically connected to any external electrical circuit. The LED chip 18 in FIG. 1 is flip chip mounted, and the conductive layer 16 preferably comprises Cu.

The substrate 12 with the LED chip 18 is preferably covered by an optical element (not shown), for instance an optical lens or a collimator. Also, the bottom side of the substrate 12 is preferably soldered to a heat sink (not shown) for allowing thermal dissipation.

According to the invention, there is further provided an isolating layer 20 covering the substrate 12 and the conductive layer 16. The isolating layer 20 can for example be an organic PI or BCB layer. The isolating layer is provided with contact holes 22 for allowing connection between the LED chip 18 and the tracks of the structured conductive layer 16.

Further, on top of the isolating layer 20, there is provided a separate unstructured reflecting layer 24. The reflective layer 24 preferably comprises Al or Ag, both of which exhibit excellent reflective characteristics. The layer 24 covers an area of the substrate surrounding the LED 18 and is not limited to the extension of the conducting layer 16. Preferably, essentially the entire area of the substrate not occupied by any LED chip is covered by the unstructured reflective layer 24 so that the largest possible reflective area is obtained. Accordingly, as shown in FIG. 1, the LED 18 is located on a first portion of the surface of the illuminator 10 where the LED makes contact with the contact pads 19, and the unstructured reflective layer 24 is applied on a second portion of the surface of the illuminator adjacent the LED 18. As shown in FIG. 1, the unstructured reflective layer 24 and the LED 18 cover substantially all the surface of the illuminator 10 not occupied by any electrical connectors 16 associated with LED 18 shown in FIG. 1, or not occupied by any electrical connectors 16 associated with the LED 26 shown in FIG. 2.

Upon operation of the illuminator 10, the reflective layer 24 serves to reflect light generated by the LED 18 away from the substrate and out of any lens covering the substrate and the chip. Due to the unstructured nature of the reflective layer 24, any absorption of light by irregularities such as the structured conductive layer 16 or the substrate 12 is prevented. This results in that the optical efficiency of the illuminator 10 is improved. Due to the isolating layer 20, there is no short-circuiting between the separate reflective layer 24 and conductive layer 16.

It should be noted that it is possible to have the unstructured reflective layer partly under the LED, i.e. the reflective layer is only etched off at the contact pads of the LED.

FIG. 2 shows an illuminator 10 according to another embodiment of the present invention. The illuminator 10 in FIG. 2 is similar to the illuminator previously described in relation to FIG. 1, except that instead of the flip chip 18, there is provided an LED chip 26 having its top contact via a bond wire 28. As can be seen in FIG. 2, in this embodiment, the reflective layer 24 covers the area surrounding the LED 26 and the bond wire 28. However, it is also possible to have the reflective layer extending between the LED 26 and the position where the bond wire 28 connects to the conductive track 16. Thus, in that case the unstructured reflective layer is only etched off where the electrical connector(s) of the LED should connect to the underlying conductive tracks, just as described above. Except for the wire bond, the embodiment of FIG. 2 functions similar and offers similar advantages as the embodiment previously discussed in relation to FIG. 1.

It should be noted that even though only one LED chip is shown in each of the FIGS. 1-2 (for the sake of clarity), it is envisaged that the illuminator according to the invention can comprise a plurality of LED chips arranged on a single substrate, for example a plurality of flip chip mounted LEDs, a plurality of wire bonded LEDs, or any combination of both flip chip mounted and wire bonded LEDs.

The method of producing an illuminator according to the invention will now be described in relation to FIGS. 3a-3f.

First (FIG. 3a) there is provided a substrate 12 made of for example silicon (Si).

Next (FIG. 3b), a dielectric layer 14 is applied on the upper side of the substrate 12.

Next (FIG. 3c), a structured conductive layer 16 is deposited on top of the dielectric layer 14. The layer 16 preferably comprises Cu and constitutes the conductive tracks of the illuminator. However, it should be noted that any other compatible low resistance metal tracks alternatively can be used.

Next (FIG. 3d), an isolating layer 20 is applied, which layer covers the dielectric layer 14 of the substrate 12 and the structured conductive layer 16. Also, contact holes 22 are provided in the isolating layer 20 for enabling connection between the LED chip(s) to be mounted and the tracks of the conductive layer 16. The size and shape of the contact holes 22 depends on the properties of the LED chip to be mounted.

Next (FIG. 3e), a reflective layer 24 is deposited on the isolating layer 20. The reflective layer 24 preferably comprises Al or Ag. Also, parts of the reflective layer 24 is etched off in order to accommodate one or more LED chip(s).

Finally (FIG. 3f), an LED chip, in this case a flip-chip 18, is mounted so that it is in connection with the conductive tracks 16.

As above, upon operation of the illuminator, the unstructured reflecting layer 24 surrounding the LED 18 serves to reflect light generated by the LED away from the substrate 12, whereby the optical efficiency of the illuminator is improved.

The invention is not limited to the embodiments described above. Those skilled in the art will recognize that variations and modifications can be made without departing from the scope of the invention as claimed in the accompanying claims.

The invention claimed is:

1. An illuminator having an exit surface and comprising:
   a substrate;
   a structured conductive layer applied on said substrate;
   an isolating layer applied on said structured conductive layer; at least one light source located on a first portion of the exit surface of the illuminator and connected to said structured conductive layer; and
   a reflective layer applied on a part of the said isolating layer covering a second portion of the exit surface of the illuminator adjacent the at least one light source and surrounding said at least one light source, said reflective layer covering substantially all the exit surface of the illuminator not occupied by said at least one light source, wherein the reflective layer includes parts where the reflective layer is etched to accommodate the at least one light source, wherein the first portion of the exit surface is parallel to the second portion of the exit surface, and wherein the at least one light source protrudes from the reflective layer, wherein the exit surface is an outer surface of the illuminator for exit of light from the illuminator,
   Wherein, the one light source is not in direct contact with the isolating layer and the reflective layer.

2. The illuminator according to claim 1, wherein said isolating layer comprises contact holes for enabling between the at least one light source and the structured conductive layer.

3. The illuminator according to claim 1, wherein said at least one light source is one of a flip chip light source and a wire bonded light source.

4. The illuminator according to claim 1, wherein said at least one light source is a light emitting diode.

5. A method for producing an illuminator having an exit surface, said method comprising the acts of:
   providing a substrate;

applying a structured conductive layer on said substrate;

applying an isolating layer on said structured conductive layer;

applying a reflective layer on a part of the said isolating layer covering a portion of the exit surface of the illuminator;

etching parts of the reflective layer; and placing at least one light source on the parts of the reflective layer that are etched for contacting the structured conductive layer, wherein the reflective layer is on a first portion of the exit surface of the illuminator adjacent a second portion of the exit surface of the illuminator where the at least one light source is located, the reflective layer surrounding of the at least one light source, and wherein the reflective layer and the at least one light source cover substantially all the exit surface of the illuminator not occupied by any electrical connectors associated with the at least one light source, wherein the first portion of the exit surface is parallel to the second portion of the exit surface and the at least one light source protrudes from the reflective layer, and wherein the exit surface is an outer surface of the illuminator for exit of light from the illuminator, Wherein, the one light source is not in direct contact with the isolating layer and the reflective layer.

6. The method according to claim 5, further comprising the act of:

providing contact holes in the isolating layer for enabling connection the at least one light source and the structured conductive layer.

7. The illuminator of claim 1, further comprising a dielectric layer between the isolation layer and the substrate.

8. The method of claim 5, further comprising the act of forming a dielectric layer between the isolation layer and the substrate.

* * * * *